(12) United States Patent
Yamamoto

(10) Patent No.: US 11,132,182 B2
(45) Date of Patent: Sep. 28, 2021

(54) SOFTWARE DEVELOPMENT SUPPORT DEVICE, SOFTWARE DEVELOPMENT SUPPORT METHOD, AND SOFTWARE DEVELOPMENT SUPPORT PROGRAM

(71) Applicant: Yazaki Corporation, Tokyo (JP)

(72) Inventor: Shohei Yamamoto, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/822,428

(22) Filed: Mar. 18, 2020

(65) Prior Publication Data
US 2020/0334018 A1 Oct. 22, 2020

(30) Foreign Application Priority Data

Apr. 22, 2019 (JP) .............................. JP2019-080988

(51) Int. Cl.
| | | |
|---|---|---|
| *G06F 9/44* | (2018.01) | |
| *G06F 8/34* | (2018.01) | |
| *G06F 30/30* | (2020.01) | |
| *G06F 8/10* | (2018.01) | |
| *G06F 40/103* | (2020.01) | |
| *H04L 12/403* | (2006.01) | |
| *H05B 45/46* | (2020.01) | |
| *F16D 43/21* | (2006.01) | |

(52) U.S. Cl.
CPC .................. *G06F 8/34* (2013.01); *G06F 8/10* (2013.01); *G06F 30/30* (2020.01); *G06F 40/103* (2020.01); *F16D 43/21* (2013.01); *H04L 12/403* (2013.01); *H05B 45/46* (2020.01)

(58) Field of Classification Search
CPC ... G06F 8/34; G06F 8/10; G06F 30/30; G06F 40/103; F16D 43/21; H05B 45/46; B60R 16/0215; H04L 12/403
See application file for complete search history.

(56) References Cited

U.S. PATENT DOCUMENTS

| | | | | |
|---|---|---|---|---|
| 6,738,964 | B1 * | 5/2004 | Zink ........................ | G06F 30/30 |
| | | | | 717/105 |
| 7,529,268 | B1 * | 5/2009 | Solanki ................. | H04L 12/403 |
| | | | | 370/362 |
| 10,719,645 | B1 * | 7/2020 | Zhang ........................ | G06F 8/10 |
| 2005/0039160 | A1 * | 2/2005 | Santori ..................... | G06F 8/34 |
| | | | | 717/104 |

(Continued)

FOREIGN PATENT DOCUMENTS

JP 2015-5189 A 1/2015

*Primary Examiner* — Tuan A Vu
(74) *Attorney, Agent, or Firm* — Sughrue Mion, PLLC

(57) ABSTRACT

A software development support device, a software development support method and a software development support program capable of efficiently developing software are provided. A software development support program executed by a software development device is provided with a connection setting screen in which a object slave ECU to be controlled by a master ECU or a load based on an input from an input device, a label setting screen in which a label is set in a load state based on the input from the input device that are displayed on a display device, and an operation setting screen in which an operation of the master ECU is set for the slave ECU and the load based on the input device that is displayed on the display device selecting.

13 Claims, 7 Drawing Sheets

(56) References Cited

U.S. PATENT DOCUMENTS

| | | |
|---|---|---|
| 2008/0034345 A1 | 2/2008 | Curtis et al. |
| 2008/0092111 A1* | 4/2008 | Kinnucan ................. G06F 8/34 |
| | | 717/105 |
| 2008/0159633 A1* | 7/2008 | van Eikeren ......... G06F 40/103 |
| | | 382/209 |
| 2011/0295578 A1 | 12/2011 | Aldrich et al. |
| 2015/0349471 A1* | 12/2015 | Maki .................. B60R 16/0215 |
| | | 307/10.1 |
| 2017/0118816 A1* | 4/2017 | Ohashi ................... H05B 45/46 |
| 2018/0347252 A1* | 12/2018 | Zeabari ................... F16D 43/21 |

* cited by examiner

SOFTWARE DEVELOPMENT SUPPORT DEVICE, SOFTWARE DEVELOPMENT SUPPORT METHOD, AND SOFTWARE DEVELOPMENT SUPPORT PROGRAM

BACKGROUND OF THE INVENTION

Field of the Invention

The present invention relates to a software development support device, a software development method and a software development support program that support development of software, etc. in an electronic control unit (ECU) mounted on a vehicle, for example.

Description of the Related Art

In recent years, the performance of automobiles has been improved, and many ECUs are mounted on one vehicle. These ECUs control an engine, a transmission, as well as a power window, a lamp, a door mirror and the like. To create such ECU software, source code was manually input after understanding the specification of a microcomputer (microcomputer) included in the ECU or communication standards of system to which the ECU is connected.

Then, the created source code (software) is, for example, tested with an evaluation device described in Patent Literature 1 to check functions or so. The ECU evaluation device described in Patent Literature 1 collects verification data for verifying an ECU specification model that defines functions of the ECU to be evaluated, and generates input data to the ECU based on the obtained verification input data. And the ECU evaluation device determines whether expected value data of an output of ECU specification model and output data based on the input data which the ECU outputs match, and evaluates the operation of the ECU based on the determination result.

CITATION LIST

Patent Literature

Patent Literature 1: JP-A-2015-5189

SUMMARY OF THE INVENTION

However, in a step prior to deciding specifications in which changes in setting values such as parameters frequently occur or in the case of verifying while watching an operation on a real machine, it is not easy for a non-programmer system personnel to modify source code. Therefore, it was inefficient because asking cooperation of dedicated department or the like every time a change or correction is made.

Therefore, the present invention, in view of the above problems, is to provide a software development support device, a software development support method and a software development support program capable of efficiently developing software.

The invention made to solve the above-mentioned problems relates to a software development support device characterized by including a selection section from which a control object of ECU is selected based on an input of an operation input section, and an operation setting section configured to set an operation of the ECU for the control object selected by the selection section based on the input from the operation input section.

As described above, according to the present invention, parts such as control object or operation settings can be set by an intuitive method such as selection regardless of source code. Therefore, even a system engineer, who is a non-programmer, can easily make changes and corrections, and efficiently develop software.

DETAILED DESCRIPTION OF THE PREFERRED EMBODIMENTS

Figure 1:
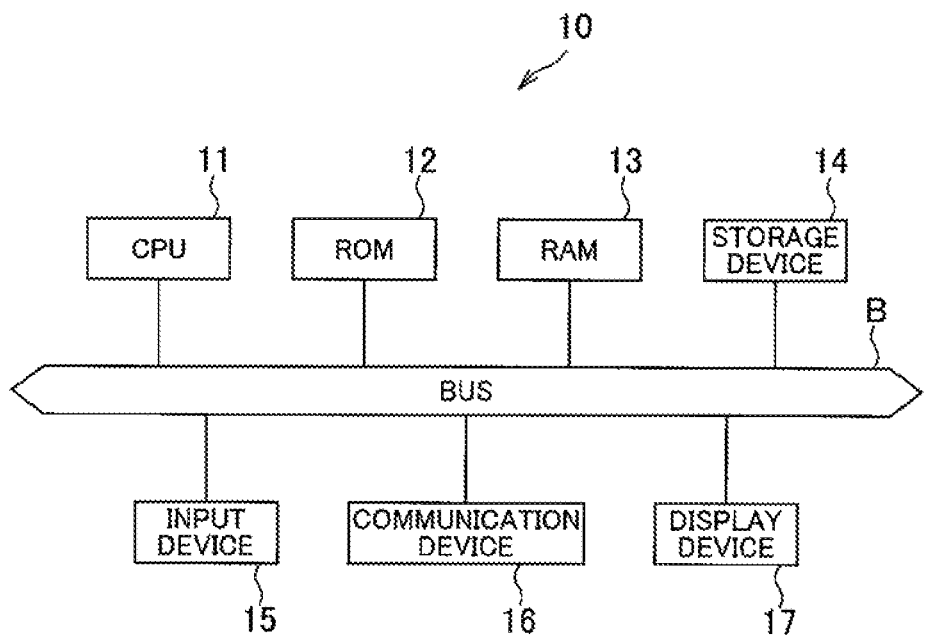
FIG. 1 is a schematic configuration diagram of a software development support device according to an embodiment of the present invention.

Hereinafter, an embodiment of the present invention will be described with reference to the drawings. FIG. 1 is a schematic configuration diagram of such a software development support device related to an embodiment of the present invention.

As shown in FIG. 1, a software development support device 10 utilizes a well-known personal computer, and includes a central processing section (CPU) 11 for performing such operations of the entire device according to a predetermined program. This CPU 11 is connected to a ROM 12 which is a read-only memory storing a program for the CPU 11 via a bus B, and a RAM 13 which is a readable and writable memory having a work area or the like for storing various data required for processing operations of the CPU 11.

A storage device 14 is connected to the CPU 11 via the bus B, for which, for example, a hard disk device, a large-capacity nonvolatile memory, or the like is used. The storage device 14 stores software development support program to be described, and various data necessary for the software development support program. The software development support program and the various data are installed from an optical disk or downloaded via a network into a storage 14.

An input device 15, a communication device 16, a display device 17, and the like are connected to the CPU 11 via the bus B. The input device 15 has a keyboard, a mouse, and the like, and outputs input data corresponding to an operation of the developer to the CPU 11. The communication device 16 uses a communication device such as a LAN card and a cellular phone modem. Then, the communication device 16 outputs received information to the CPU 11 and transmits information input from the CPU 11 a designated transmission destination.

As the display device 17, various display devices such as a well-known liquid crystal display and a CRT are used. Then, the display device 17 displays various information under control of the CPU 11. In other words, the device 17 functions as a display section for displaying various screens that support ECU program development based on the various information. With these various screens, the software development support device 10 supports program development by the developer.

Figure 2:
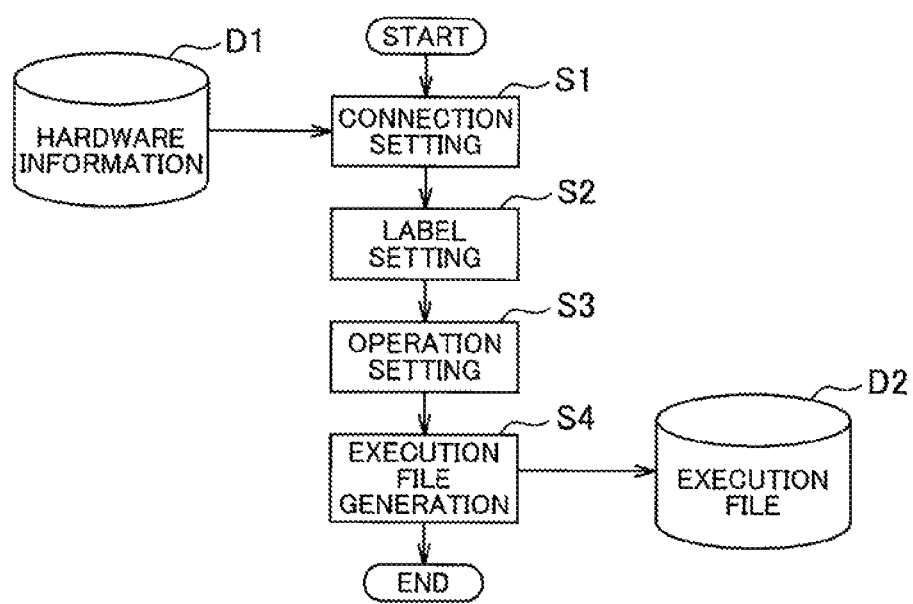
FIG. 2 is a flowchart of an operation in the software development support device shown in FIG. 1.

Next, the operation (software development support method) in the software development support device 10 of the above described configuration will be described with reference to the flowchart in FIG. 2. That is, the flowchart shown in FIG. 2 shows operations of the program (software development support program) to be executed by the CPU 11. The software development support program mainly described in this embodiment is for design and development of software that operates on a master ECU of an ECU system that communicates in a master-slave manner.

Figure 3:
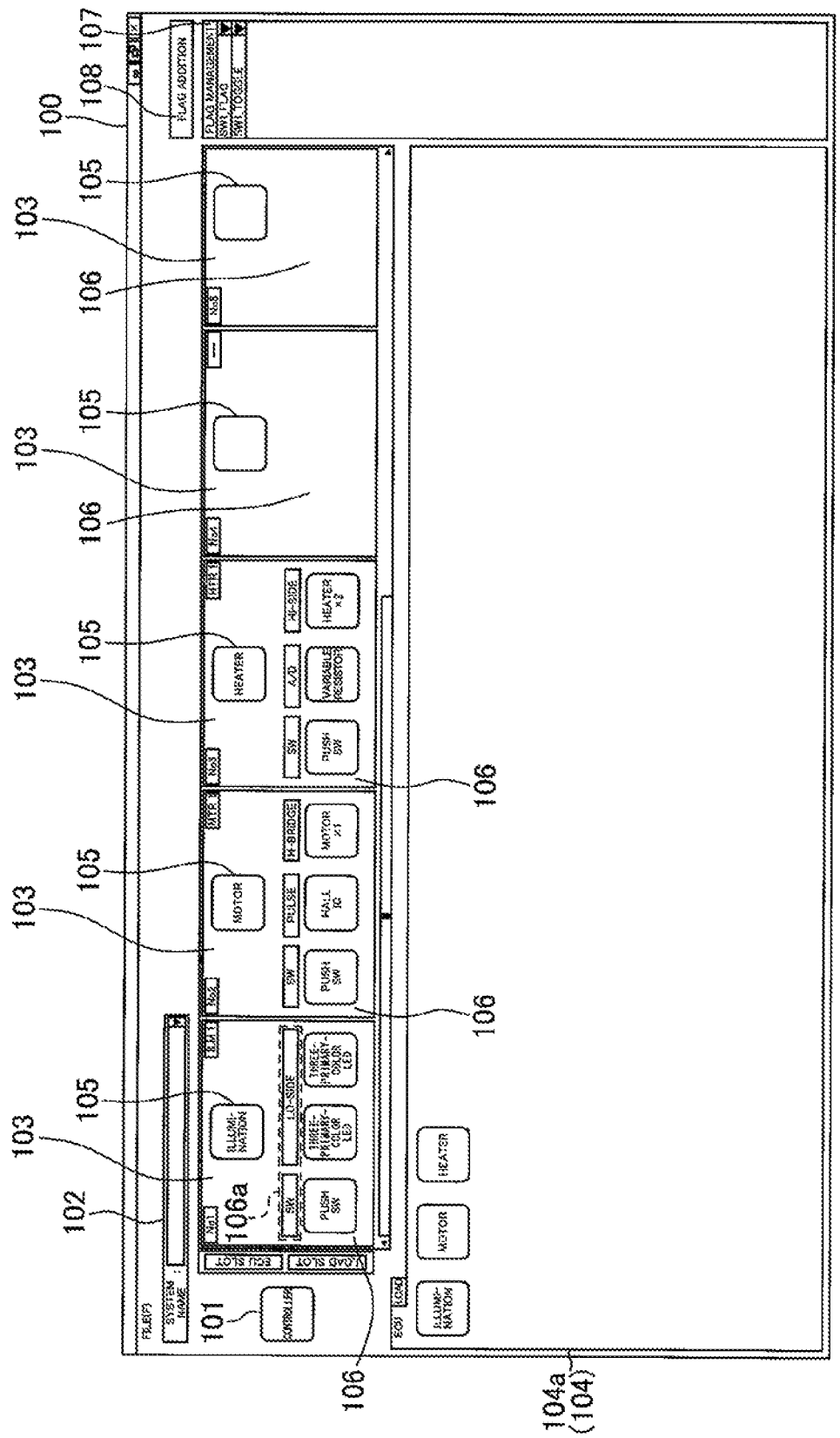
FIG. 3 is an example of a connection setting screen in the flowchart shown in FIG. 2.
Figure 4:
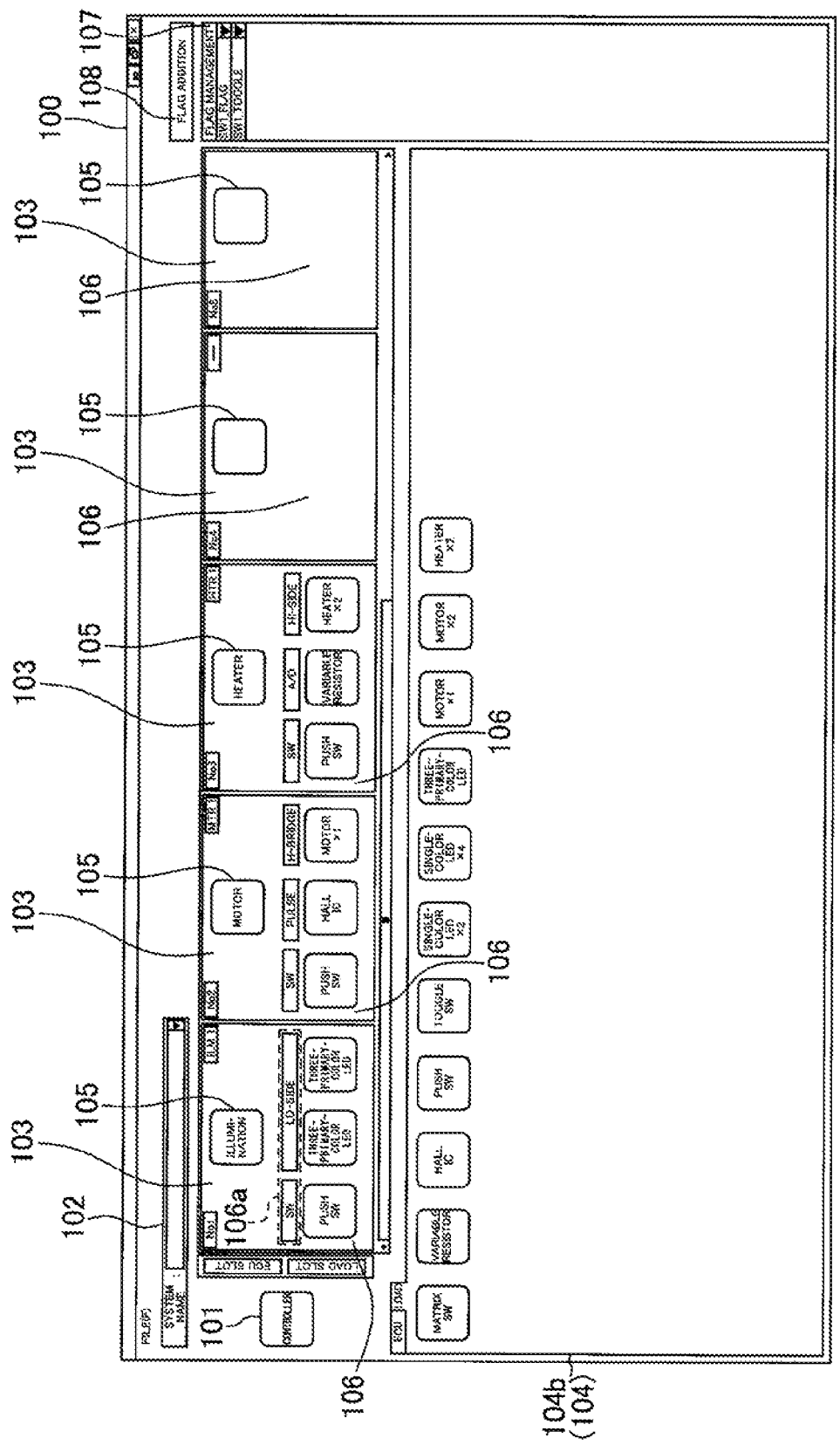
FIG. 4 is an example of a connection setting screen in the flowchart shown in FIG. 2.

First, a connection setting is performed in step S1. The connection setting means setting of the slave ECU to be connected to the master ECU and a load to be connected to the slave ECU. Information of the ECU, the load and the like used for the connection setting is set as hardware information D1, and the CPU 11 reads out and displays on a display device 17 the hardware information D1. FIGS. 3 and 4 show screen examples displayed on the display device 17 when setting up the connection setting.

As shown in FIG. 3, the connection setting is performed with the input device 15 by operating a connection setting screen 100 displayed on the display device 17. The connection setting screen 100 includes a development object ECU101, a system name 102, a load etc. setting area 103, a load etc. selection area 104, a flag management area 107, and a flag addition button 108. That is, the connection setting screen 100 functions as a selection section in which the control object of the ECU is selected based on the input from the input device 15 (operation input section).

The development object ECU 101 sets the ECU which is the development object. The development object ECU 101, as shown in FIG. 3, may be displayed as an icon or the like, or may be character information or the like. The system name 102 denotes a column for inputting a name of a system to be developed. Note that the development object ECU 101 or the system name 102 is optional and need not be provided.

On the load etc. setting area 103, the ECU (slave ECU) controlled by the development object ECU (master ECU), and a load connected to the slave ECU are set. That is, the control object of the master ECU in the present embodiment is hardware. Connection relation of the hardware is set on the connection setting screen 100. The load etc. setting area 103, as shown in FIG. 3, is provide plurally, and slave ECU can be set plurally.

The load etc. setting area 103 includes an ECU slot 105, and a load slot 106. The ECU slot 105 is set such that an icon and the like of the ECU selected from the slave ECU selection area 104a of a selection area 104 described later is dragged and dropped. In the example of FIG. 3, three ECU slots 105 have been set, where an illumination ECU, a motor ECU, and a heater ECU are each set.

The load slot 106 is set by dragging and dropping the selected load icon or the like which is selected from a load selection area 104b of a load etc. selection area 104 described later. In the example of FIG. 3, a push switch (SW) and two three-primary-color LEDs are set for the illumination ECU. A push switch, a Hall IC, and a single motor (Motor×1) are set for the motor ECU. Furthermore, a push switch, a variable resistor, and two heaters (heater×2) are set for the heater ECU.

In the load slot 106, when the slave ECU is set, a type of available load capable of being connected to the slave ECU is displayed (reference numeral 106a). The load type 106a can be identified by a type name. Further, color may be changed for each type. For example, when switch (SW) and LO-SIDE are available as types of loads that can be connected to ECUs, the switch may be displayed in light blue and the LO-SIDE in orange.

The load etc. selection area 104 has an ECU or load that can be set in the load etc. setting area 103 displayed. That is, the load etc. selection area 104 functions as a control object display section on which a control object is displayed.

The load etc. selection area 104 includes a slave ECU selection area 104a and a load selection area 104b (see FIG. 4). The slave ECU selection area 104a and load selection area 104b can be switched to each other by a tab type.

In the slave ECU selection area 104a, the ECU to be connected to the master ECU as shown in FIG. 3 is displayed as an icon or the like. And any ECU icon is selected from these displayed icons etc. and is set to the ECU slot 105 by drag and drop operation.

In the load selection area 104b, as shown in FIG. 4, the load is displayed as an icon or the like. Then, the icon of the arbitrary ECU is selected from the displayed icons and the like, and is set to the load slot 106 by drag and drop operation.

Here, what are included in the load displayed in the load selection area 104b in the hardware information D1 are in principle all displayed. This is because, as shown in FIG. 4, if a plurality of slave ECUs is set, load can be freely set for any slave ECU.

Therefore, depending on the load, the load slot 106 corresponding to the unconnectable ECU may be set mistakenly. Therefore, the icons are colored and displayed according to the load type 106a described above. For example, if the switch is light blue in the load type 106a, the corresponding icon (push switch, toggle switch) is colored light blue. Also, if the LO-SIDE is orange in the load type 106a, the icons (single-color LED×3, single-color LED×4, three-primary-color LED) are colored orange corresponding to the LO-SIDE. Matching the color of the icon and the type of load can prevent combination of ECU and load that cannot be connected in principle from being set.

That is, the load selection area 104b (the control object display section) displays the control object in different colors according to the type of the control object, and the load slot 106 (control object setting section) is indicated with sellable type of colors.

Figure 5:
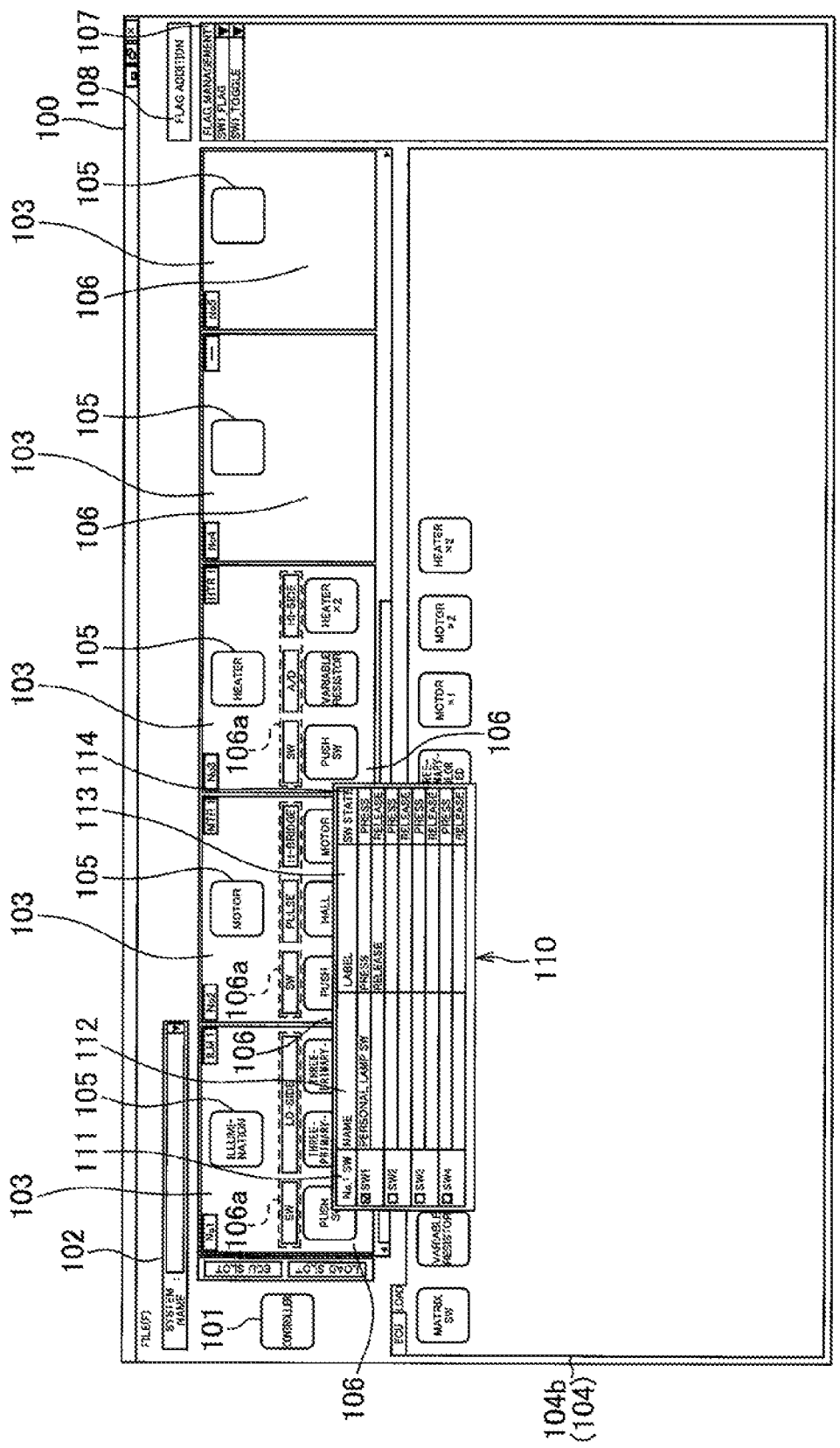
FIG. 5 is an example of a label setting screen in the flowchart shown in FIG. 2.
Figure 6:
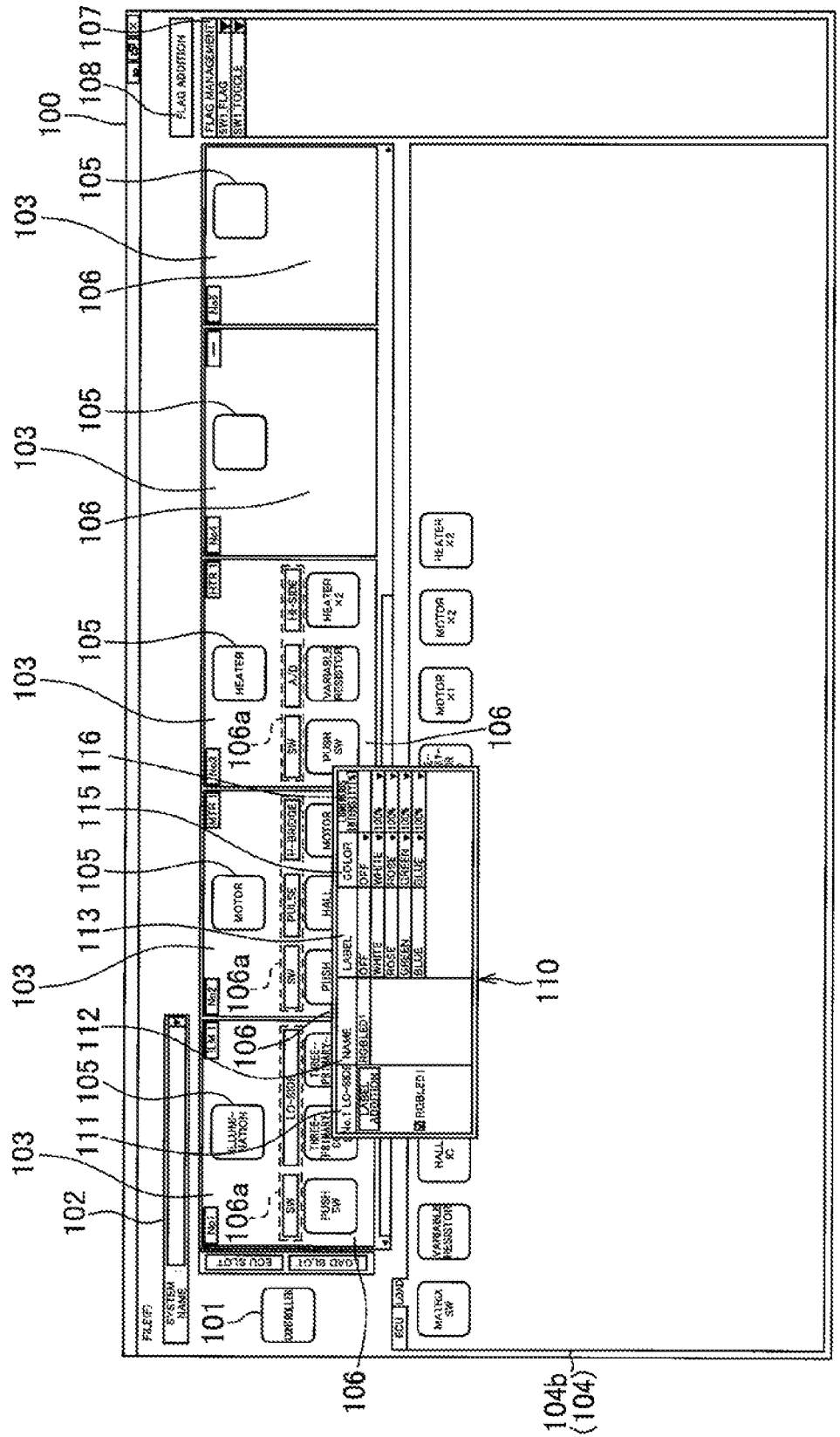
FIG. 6 is an example of a label setting screen in the flowchart shown in FIG. 2.

Next, label setting is performed in step S2 of FIG. 2. The label setting is to set an arbitrary label for load condition set in the load slot 106. FIGS. 5 and 6 show specific examples of the Label setting.

As shown in FIG. 5, the label setting is performed by operating the label setting screen 110 displayed on the display device 17. The label setting screen 110 is displayed by clicking the icon of the load in which label is set on the connection setting screen 100. That is, the label setting screen 110 is displayed on the display device 17 associated with the load icon (control object) selected on the connection setting screen 100.

The label setting screen 110 includes a load 111, a name 112, a label 113, and a state 114. That is, the label setting screen 110 functions as a label setting section that sets a label in an operation status of the control object based on the input on the input device 15 (operation input section).

The load 111 indicates the specific contents of the load indicated by the icon. For example, in the case of the push switch in FIG. 5, up to four switches can be set, but only one is selected by the check box. The name 112 indicates the name of the load. For example, in FIG. 5, a personal lamp SW is set, and a name associated with another load (three-primary-color LEDs) can be set.

The label 113 can be set for each state 114 described later, and an arbitrary name can be denoted. In the example of FIG. 5, while the contents are the same as those of the state 114, for example, the label of the state "press" may be set to "ON", and the label of the state "release" may be set to "OFF". This label 113 is to support development such that at the time of operation setting described later, when it is difficult to understand terms and the like set in the state 114 or when it is difficult to identify multiple statuses, the name or the description and the like can be applicable. Therefore, the label setting is optional and the contents may be the same as the status 114, or the label 113 may not be set. Or the default label can be set automatically and can be changed arbitrarily.

The state 114 indicates the state of the load. In the example of FIG. 5, as it is a push switch, two states of "press" and "release" are set. This state is set in advance in the hardware information D1.

Note that the load state is not limited to one item of the state 114 as shown in FIG. 5. FIG. 6 shows the label setting screen 110 for three-primary-color LEDs as a load. Where the load 111, the name 112, and the label 113 are only changed to contents according to the contents of the load (three-primary-color LEDs).

On the other hand, the label setting screen 110 shown in FIG. 6 is provided with a color 115 and a luminous intensity 116 as state. The color 115 indicates color when the three-primary-color LEDs emit light, white, rose, green, blue or the like can be set from a pull-down menu, and this color includes an OFF state. The luminous intensity 116 indicates brightness when the three-primary-color LEDs emit light, and can be set from pull-down menu by 1% unit from 1 to 100% (by 10% unit, etc. instead of 1% unit).

In the example of FIG. 6, the label 113, while having the same contents as the color 115, may have such contents as being combined with a luminous intensity such as "white 100". In other words, if there is an item of multiple states as a label, the combination of them is set to a label, making easier to perform operation setting.

Figure 7:
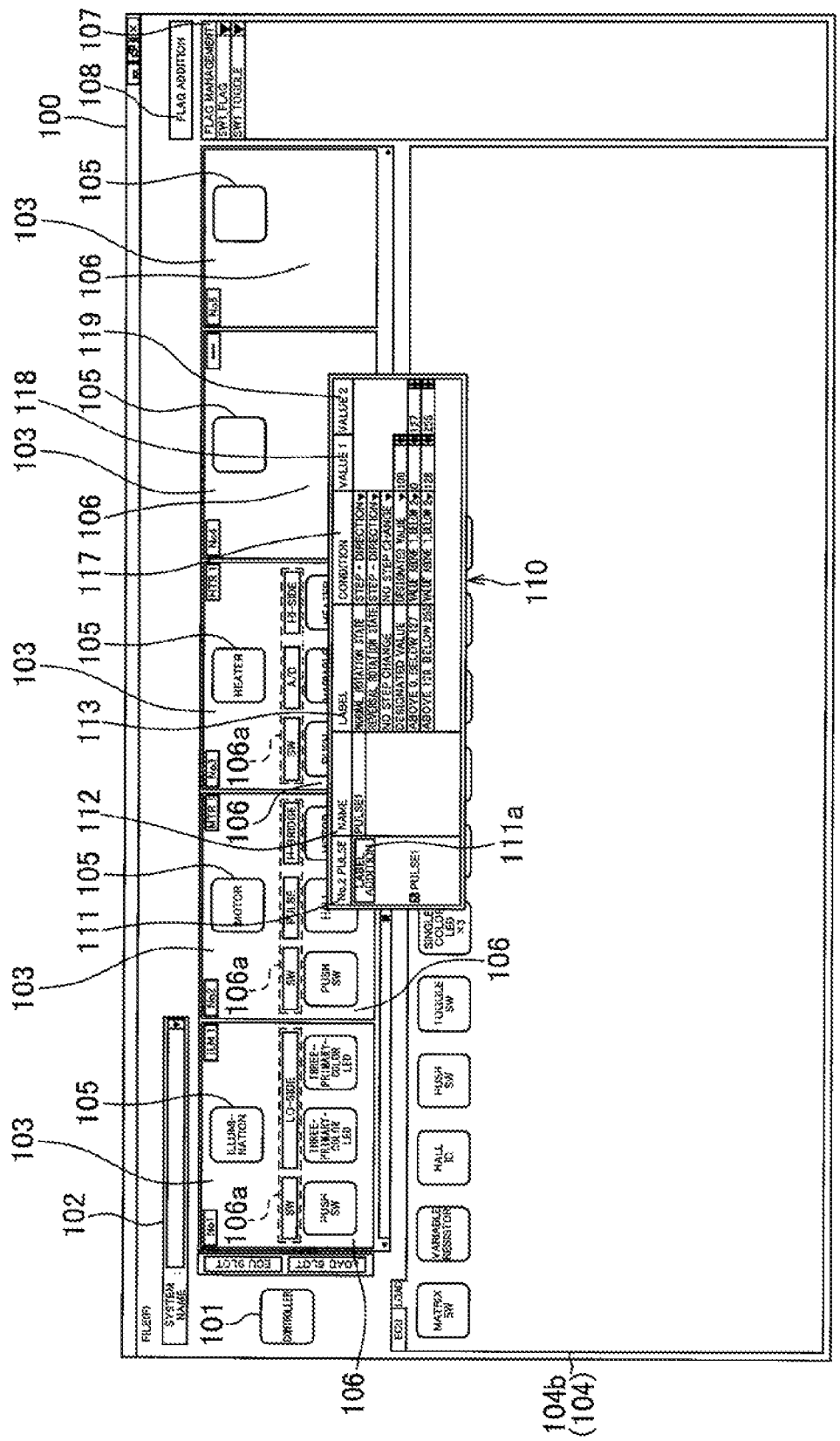
FIG. 7 is an example of label setting screen in the flowchart shown in FIG. 2.

Also, the label setting screen 110 shown in FIG. 7 is provided with a condition 117, a value 1 and a value 2. The condition 117 indicates an output condition of the Hall IC as a load. The value 1 and the value 2 indicate the values of the output conditions of the Hall IC. That is, the value 1 and the value 2 indicate variables. In this way, the label can be set also with variable included in the state.

Further, on the connection setting screen 100, a flag management area 107 and a flag addition button 108 are provided (see FIGS. 3 to 7). The flag management area 107 can set various flags used in the program (software) of the master ECU. In FIGS. 3 to 7, two of SW1_FLAG and SW1_TOGGLE is set. Flag addition button 108 is operated when a new flag is added.

Figure 8:
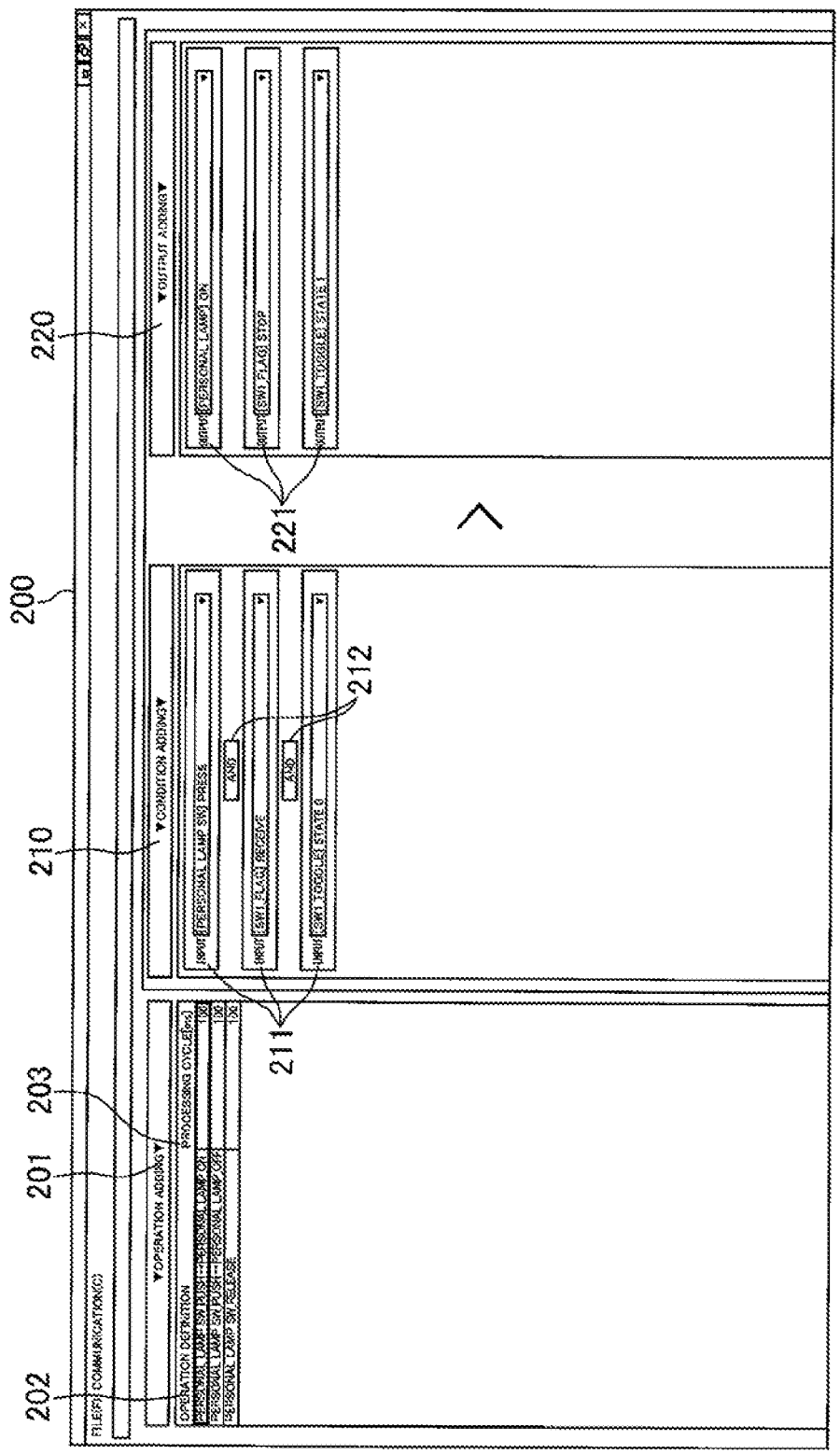
FIG. 8 is an example of an operation setting screen in the flowchart shown in FIG. 2.

Next, the operation is set in step S3 in FIG. 2. The operation setting refers to setting operation of the software that runs on the master ECU using each of the setting contents of the connection setting in step S1 and the label settings in step S2. FIG. 8 shows a specific example of the operation setting.

As shown in FIG. 8, the operation setting is performed by operating an operation setting screen 200 displayed on the display device 17 with the input device 15. The operation setting screen 200 can, for example, switch from the connection setting screen 100 using a file menu or the like. The operation setting screen 200 includes a work adding section 201, a condition adding section 210, and an output adding section 220. That is, the operation setting screen 200 works as the operation setting section that sets the operation of the ECU for the control object selected by the connection setting screen 100 (selection section) based on the input from the input device 15 (input section).

The operation adding section 201 sets the operation of the master ECU. An action is a function or a subroutine and the like for example. The operation adding section 201 includes an operation definition 202 and a processing cycle 203. The operation definition 202 defines an operation name (a function name, a subroutine name, and the like). In example of FIG. 8, three functions are defined such as PERSONAL LAMP SW PRESS→PERSONAL LAMP_ON, PERSONAL LAMP SW PRESS→PERSONAL LAMP_OFF and LAMP SW RELEASE.

The processing cycle 203 sets a cycle of the operation defined by the operation definition 202. In the example of FIG. 8, 100 ms (milliseconds) is set, but may be any other time, and the cycle may vary from operation to operation.

A condition adding section 210 and an output adding section 220 are set for each operation defined in the operation definition 202. That is, the condition adding section 210 and the output adding section 220 indicate specific operation contents of each function and the like. The condition adding section 210 includes an input 211 and a logic 212. The input 211 sets input (input condition) of the concerned operation. The logic 212 sets multiple inputs 211 when performing logical operation.

The example of FIG. 8 shows input about operation of [PERSONAL LAMP SW] press→[PERSONAL LAMP_ON]. In FIG. 8 [PERSONAL LAMP SW] press, [SW1_FLAG] receive, and [SW1_TOGGLE] STATE 0 are set as input. This press [PERSONAL LAMP SW] displays the name 112 of the label setting and label 113 shown in FIG. 5. Similarly, receive [SW1_FLAG] and [SW1_TOGGLE] STATE 0 also show the flag name of the flag management area 107 and its state.

"AND" is set as the logic 212 in the example of FIG. 8. That is, logical operation is set as the logical product. That is, when the personal lamp SW is in the pressed state, SW1_FLAG is in an accepting state and SW1_TOGGLE is in state 0, an output described later is not performed. In the example of FIG. 5, there are two logics 212, which can be increased or decreased corresponding to the number of inputs 211. Further, the logic 212 may set, not limited to "AND", other logic operation such as "OR" (logic sum) and "Ex OR" (exclusive OR).

The output adding section 220 shows specific output contents made at the time that the condition set by the condition adding section 210 in each operation (function, etc.) is true. The output adding section 220 includes the output 221. The output 221 sets the output (output information) of the operation.

In the example of FIG. 8, the output of operation is shown of PERSONAL LAMP SW PRESS→PERSONAL LAMP_ON. In FIG. 8, [PERSONAL LAMP] ON, [SW1_FLAG] STOP, and [SW1_TOGGLE] STATE 1 is set as outputs. In this [PERSONAL LAMP] ON, the label setting name 112 and the label 113 are also displayed in the same manner as the input 211. Note that "PERSONAL LAMP" and "ON" displayed in FIG. 8 shown in FIG. 8 is the name and label set for the three-primary-color LEDs of LO-SIDE instead of the push switch shown in FIG. 5. That is, different loads may be set for the input and the output.

In the example of FIG. 8, when the input set in the condition adding section 210 is true, the personal lamp is set to be turned on, SW1_FLAG stopped, and SW1_TOGGLE in state 1.

As described above, the condition adding section 210 functions as an input setting section for setting input conditions for the operation of the ECU based on the label 113 set on the label setting screen 110 (label setting section). Further, the output adding section 220 functions as an output setting section that sets the output information corresponding to the input condition set in the condition adding section 210 (input setting section).

Then, when the operation is completed up to the operation setting in step S3, an execution file is generated in step S4 in FIG. 2 and is output based on the operation setting of step S3. In this step S4 an execution file may be generated after automatically generating source code as an intermediate file, or the execution file may be generated directly.

The generated execution file D2 is transferred to the master ECU by a predetermined means, and verification such as debugging with real machine works. Then, if it becomes necessary to make corrections, step S1 is executed. At the time of correction, for example, when the setting on the label setting screen 110 is changed, step S1 may be omitted. Alternatively, if setting on the operation setting screen 200 wants to be changed, the settings, steps S1 and S2 may be omitted.

As is clear from the above description, step S1 works as a selection step, and step S3 is an operation setting step.

In the software development program executed by the software development device 10 of the present embodiment, the connection setting screen 100 for selecting the slave ECU and the load is displayed on the display device 17 which is controlled by the master ECU based on the input from the input device 15. And the label setting screen 110 for setting the label for the load state based on the input from the input device 15 on the display device 17. Further, in the software development program the operation setting screen 200 is displayed on the display device 17 that sets the operation of the master ECU with respect to the slave ECU and the load based on the input from the input device 15.

With such software development program, the parts of the control object or the operation settings can be set in an intuitive way, such as selection, instead of operation such as inputting source code. Also, setting labels can make the contents, difficult-to-understand conditions, and difficult parameters easily understood and identified. Therefore, non-grammar system personnel can easily make changes and corrections, and efficiently use software development.

The operation setting screen 200 is provided with the condition adding section 210 for setting input conditions based on the label set on the label setting screen 110, and the output adding section 220 for setting output information corresponding to the input conditions set in the condition adding section 210. Therefore, it is possible to set the input conditions and the output information based on the label. Therefore, even non-programmer system personal can easily make changes and corrections.

Also, the label setting screen 110 is displayed when clicking the icon of the load selected on the connection setting screen 100, making easy to set labels for each load.

The connection setting screen includes the load selection area 104 for displaying the selectable slave ECU and the load, and the load etc. setting area 103 in which the slave ECU and the load selected from the load etc. selection area 104 are set. The load etc. selection area 104 changes in color and displays the icon corresponding to the type of the load, and the load etc. setting area 103 is displayed in which the sellable load type 106a differs in colors. Therefore, setting combination of ECU and the load that cannot be connected can be prevented.

Although the above-described embodiment develops the software that operates on the master ECU of the ECU system communicating in the master-slave system, it can also be applied to software development for the slave ECU. With the slave ECU, only the load may be set in the load etc. setting area 103. In other words, if the ECU has the control object, the slave and the slave are not particularly limited.

In addition, input means such as pull-down menus, check boxes, or drag, drop, and the like on the screens shown in the above-described embodiment are not limited to the illustrated means, and other well-known means may be appropriately applied.

The present invention is not limited to the above embodiment. In other words, those skilled in the art can make and perform various modifications according to the conventionally well-known knowledge without departing from the gist of the present invention. The modifications, as long as has the configuration of the software development support device, the software development support method and the software development support program according to the present invention, are included in the scope of the present invention.

REFERENCE SIGNS LIST

10 Software development support device
11 CPU
15 Input device (operation input section)
17 Display device (display section)
100 Connection setting screen (selection section)
103 Load setting area (control object setting section)
104 Load selection area (control object display section)
110 Label setting screen (label setting section)
113 Label
114 State (state of operation in the controlled object)
115 Colors (operational state of the control object)
116 Luminous intensity (state of operation in controlled object)
117 Condition (State of Operation in Controlled Object)
118 Value 1 (operation state of the control object)
119 Value 2 (operation state of the controlled object)
200 Connection setting screen (operation setting section)
210 Add condition (input setting part)
220 Output added (output setting part)

What is claimed is:

1. A software development support device comprising:
a selection section for selecting a control object of an ECU based on an input from an operation input section;
an operation setting section wherein an operation of the ECU is set for the control object selected by the selection section based on the input from the operation input section; and
a display, wherein
the control object includes a slave ECU and a load connected to the slave ECU, and
wherein the selection section is configured to control the display to display a first screen,
wherein the operation setting section is configured to control the display to display a second screen separate from the first screen, wherein the first screen comprises a plurality of sections configured to accept ones of a plurality of control objects of a plurality of ECUs including the control object of the ECU, and wherein the ECU is a master ECU of the plurality of ECUs which are slave ECUs of the master ECU.

2. The software development support device according to claim 1, further comprising a label setting section in which a label is set in a state of the control object based on the input from the operation input section.

3. The software development support device according to claim 2, wherein the operation setting section includes an input setting section for setting an input condition of the operation of the ECU based on the label set at the label setting section, and an output setting section for setting output information corresponding to the input condition set at the input setting section.

4. The software development support device according to claim 3, wherein the selection section is provided with a control object display section on which the control object is displayed on a display section, and a control object setting section where the control object is selected from the control object display section based on the input from the operation input section, wherein the control object display section displays the control object in different colors according to a type of the control object, and the type that can be set is indicated by a color in the control object setting section.

5. The software development support device according to claim 3, wherein the label setting section is displayed on a display section associated with the control object selected by the selection section.

6. The software development support device according to claim 5, wherein the selection section is provided with a control object display section on which the control object is displayed on a display section, and a control object setting section where the control object is selected from the control object display section based on the input from the operation input section, wherein the control object display section displays the control object in different colors according to a type of the control object, and the type that can be set is indicated by a color in the control object setting section.

7. The software development support device according to claim 2, wherein the label setting section is displayed on a display section associated with the control object selected by the selection section.

8. The software development support device according to claim 7, wherein the selection section is provided with a control object display section on which the control object is displayed on a display section, and a control object setting section where the control object is selected from the control object display section based on the input from the operation input section, wherein the control object display section displays the control object in different colors according to a type of the control object, and the type that can be set is indicated by a color in the control object setting section.

9. The software development support device according to claim 2, wherein the selection section is provided with a control object display section on which the control object is displayed on a display section, and a control object setting section where the control object is selected from the control object display section based on the input from the operation input section, wherein the control object display section displays the control object in different colors according to a type of the control object, and the type that can be set is indicated by a color in the control object setting section.

10. The software development support device according to claim 1, wherein the selection section is provided with a control object display section on which the control object is displayed on a display section, and a control object setting section where the control object is selected from the control object display section based on the input from the operation input section, wherein the control object display section displays the control object in different colors according to a type of the control object, and the type that can be set is indicated by a color in the control object setting section.

11. The software development support device according to claim 1, wherein the master ECU is configured to control each of the plurality of control objects through respective ones of the plurality of ECUs, wherein the operation setting section is configured to control the display to display ones of a plurality of second screens, including the second screen, separate from the first screen and respective to each of the ones of the plurality of ECUs, and wherein each of the plurality of second screens comprises at least one portion configured to receive a user selection of at least one of logical operations between functions, wherein the logical operations comprise an AND operation, an OR operation, and an XOR operation.

12. A software development support method that is executed by a software development support device that supports development of ECU software, comprising the steps of:

a selection step of selecting a control object of an ECU based on an input from an operation input section;

an operation setting step of setting an operation of the ECU for the control object selected in the selection step based on the input from the operation input section, wherein the control object includes a slave ECU and a load connected to the slave ECU, wherein the selection step further comprises controlling a display to display a first screen, wherein the operation step further comprises controlling the display to display a second screen separate from the first screen, wherein the first screen comprises a plurality of sections configured to accept ones of a plurality of control objects of a plurality of ECUs including the control object of the ECU, and wherein the ECU is a master ECU of the plurality of ECUs which are slave ECUs of the master ECU.

13. A software development support program, comprising:

functioning a computer of a software development support device that supports software development of an ECU as a selection section for selecting a control object of the ECU based on an input from an operation input section, and an operation setting section for setting an operation of the ECU for the control object selected by the selection section based on the input from the operation input section, wherein the control object includes a slave ECU and a load connected to the slave ECU, wherein the selection section is configured to control a display to display a first screen, wherein the operation step is configured to control the display to display a second screen separate from the first screen, wherein the first screen comprises a plurality of sections configured to accept ones of a plurality of control objects of a plurality of ECUs including the control object of the ECU, and wherein the ECU is a master ECU of the plurality of ECUs which are slave ECUs of the master ECU.

* * * * *